United States Patent
Kim et al.

(10) Patent No.: US 9,106,756 B2
(45) Date of Patent: Aug. 11, 2015

(54) APPARATUS AND METHOD FOR DETECTING PROXIMITY BY PROXIMITY SENSOR IN PORTABLE TERMINAL

(75) Inventors: Sang-Su Kim, Suwon-si (KR);
Dong-Min Yoo, Yongin-si (KR);
Tae-Woo Noh, Suwon-si (KR);
Seung-Joo Hyun, Seoul (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 326 days.

(21) Appl. No.: 13/436,407

(22) Filed: Mar. 30, 2012

(65) Prior Publication Data

US 2012/0252527 A1    Oct. 4, 2012

(30) Foreign Application Priority Data

Apr. 1, 2011   (KR) .................. 10-2011-0030049

(51) Int. Cl.
*G08B 1/08*   (2006.01)
*H04M 1/67*   (2006.01)

(52) U.S. Cl.
CPC ............ *H04M 1/67* (2013.01); *H04M 2250/12* (2013.01)

(58) Field of Classification Search
CPC .................................................... G06F 3/0488
USPC .............. 340/539.13, 539.11, 555, 552, 556, 340/568.1
See application file for complete search history.

(56) References Cited

U.S. PATENT DOCUMENTS

| | | | |
|---|---|---|---|
| 2010/0127159 A1 | 5/2010 | Watanabe | |
| 2010/0294938 A1* | 11/2010 | Alameh et al. | 250/342 |
| 2011/0090163 A1* | 4/2011 | Lee | 345/173 |
| 2013/0190054 A1* | 7/2013 | Kulas | 455/566 |

FOREIGN PATENT DOCUMENTS

KR   10-2007-0002545   1/2007

* cited by examiner

*Primary Examiner* — Daryl Pope

(57) ABSTRACT

An apparatus and method is configured to detect the proximity of an object using a proximity sensor in a portable terminal. A method for detecting the proximity of an object in a portable terminal mounted with a proximity sensor includes setting a reference light-receiving quantity according to a hairstyle of a user of the portable terminal, emitting light, detecting a light-receiving quantity corresponding to the emitted light, and determining the proximity/non-proximity of an object by comparing the light-receiving quantity with the reference light-receiving quantity.

20 Claims, 5 Drawing Sheets

APPARATUS AND METHOD FOR DETECTING PROXIMITY BY PROXIMITY SENSOR IN PORTABLE TERMINAL

CROSS-REFERENCE TO RELATED APPLICATION(S) AND CLAIM OF PRIORITY

The present application is related to and claims priority under 35 U.S.C. §119 to an application filed in the Korean Intellectual Property Office on Apr. 1, 2011 and assigned Serial No. 10-2011-0030049, the contents of which are incorporated herein by reference.

TECHNICAL FIELD OF THE INVENTION

The present invention relates generally to a portable terminal mounted with a proximity sensor, and in particular, to an apparatus and method for detecting the proximity (or approach) of an object by a proximity sensor in a portable terminal.

BACKGROUND OF THE INVENTION

Portable terminals are evolving into multimedia communication devices that provide not only a voice call service but also a data transmission service and various additional services. In addition, with an increase in the number of services provided by portable terminals, an increasing interest taken in User Interface (UIs) for controlling portable terminals.

A touchscreen-based portable terminal includes a proximity sensor for preventing a malfunction during a call. For example, when a user calls with a touchscreen-based portable terminal, the user touches the touchscreen-based portable terminal to his ear or cheek. In this case, the touchscreen-based portable terminal may malfunction due to an undesired key input caused by the touch to the user's ear or cheek. Accordingly, if detecting the proximity (or approach) of the user (i.e., the coverage of its receiver) by the proximity sensor, the touchscreen-based portable terminal enables a screen lock mode to prevent the malfunction. Also, if detecting the withdrawal of the user from the touchscreen-based portable terminal by the proximity sensor during the screen lock mode, the touchscreen-based portable terminal disables the screen lock mode.

Typically, the proximity sensor includes a photodiode as illustrated in FIG. 1.

FIG. 1 block illustrates a conventional proximity sensor.

Referring to FIG. 1, a proximity sensor 100 includes a light emitting unit 102 and a light receiving unit 104.

The proximity sensor 100 determines the proximity (or approach) of an object on the basis of the quantify of light that is received by the light receiving unit 104 after being emitted by the light emitting unit 102 and reflected by the object (hereinafter referred to as a light-receiving quantity).

If a portable terminal uses a proximity sensor, the portable terminal sets a reference light-receiving quantity for determining the proximity (or approach) of an object. Accordingly, if a light-receiving quantity detected by a light receiving unit of the proximity sensor is larger than the reference light-receiving quantity, the portable terminal determines that the object has approached thereto. Alternatively, if the light-receiving quantity detected by the light receiving unit of the proximity sensor is smaller than the reference light-receiving quantity, the portable terminal determines that the object has not approached thereto. Herein, the reference light-receiving quantity is set on the basis of a reference proximity detection distance of the object from the proximity sensor, at which the proximity sensor detects that the object has approached thereto.

In general, reflectors have different light reflectances according to their colors. For example, reflectors have different light reflectances according to their colors as shown in Table 1 below.

TABLE 1

| reflectance | 3% | 9% | 12% | 18% | 24% | 36% | 48% | 93% |
|---|---|---|---|---|---|---|---|---|
| color | Black | Cobalt Violet | Emerald Brown | Grey Green Blue Red | Light Green Orange | Light Grey Yellow Sky Blue Pink Light Violet | Light Yellow Light Sky Light Pink | White |

If reflectors have different light reflectances as described above, even if the reflectors are located at the same distance, a light-receiving quantity detected by a light receiving unit of a proximity sensor varies according to the light reflectance of each reflector.

If the reference light-receiving quantity is set on the basis of a white object, because a black object has a low light reflectance than the white object, the proximity sensor may fail to detect the proximity of the black object or its proximity detection distance may decrease.

Therefore, a portable terminal mounted with a proximity sensor requires a scheme for adaptively detecting the proximity of a reflector according to the light reflectance of the reflector.

SUMMARY OF THE INVENTION

To address the above-discussed deficiencies of the prior art, it is a primary object to provide at least the advantages below. Accordingly, one aspect of the present disclosure is to provide an apparatus and method for detecting the proximity (or approach) of an object by a proximity sensor in a portable terminal.

Another aspect of the present disclosure is to provide an apparatus and method for reducing a variation in the proximity detection distance of a proximity sensor according to the light reflectance of an object in a portable terminal.

A further aspect of the present disclosure is to provide an apparatus and method for adaptively setting a reference light-receiving quantity used to detect the proximity of an object by a proximity sensor in a portable terminal, according to the light reflectance of an object.

Yet another aspect of the present disclosure is to provide an apparatus and method for adaptively setting a reference light-receiving quantity used to detect the proximity of an object by a proximity sensor in a portable terminal, according to the hair color of a user of the portable terminal.

Yet another aspect of the present disclosure is to provide an apparatus and method for adaptively setting a reference light-receiving quantity used to detect the proximity of an object by a proximity sensor in a portable terminal, according to the hairstyle of a user of the portable terminal.

Yet another aspect of the present disclosure is to provide an apparatus and method for setting a reference light-receiving quantity used to detect the proximity of an object by a proximity sensor in a portable terminal, according to the average of light-receiving quantities during a reference time.

According to an aspect of the present disclosure, a method for detecting the proximity of an object in a portable terminal mounted with a proximity sensor includes: setting a reference light-receiving quantity according to a hairstyle of a user of the portable terminal; emitting light; detecting a light-receiving quantity corresponding to the emitted light; and determining the proximity/non-proximity of an object by comparing the light-receiving quantity with the reference light-receiving quantity.

According to another aspect of the present disclosure, a method for detecting the proximity of an object in a portable terminal mounted with a proximity sensor includes: setting a reference light-receiving quantity according to an average of light-receiving quantities measured during a predetermined time; emitting light; detecting a light-receiving quantity corresponding to the emitted light; and determining the proximity/non-proximity of an object by comparing the light-receiving quantity with the reference light-receiving quantity.

According to another aspect of the present disclosure, an apparatus for detecting the proximity of an object in a portable terminal includes: a proximity sensor that emits light and detects a light-receiving quantity corresponding to the emitted light; and a control unit that determines the proximity/non-proximity of an object by comparing the light-receiving quantity detected by the proximity sensor with a reference light-receiving quantity set according to a hairstyle of a user of the portable terminal.

According to another aspect of the present disclosure, an apparatus for detecting the proximity of an object in a portable terminal includes: a proximity sensor that emits light and detects a light-receiving quantity corresponding to the emitted light; and a control unit that determines the proximity/non-proximity of an object by comparing the light-receiving quantity detected by the proximity sensor with a reference light-receiving quantity set according to an average of light-receiving quantities measured during a predetermined time.

Before undertaking the DETAILED DESCRIPTION OF THE INVENTION below, it may be advantageous to set forth definitions of certain words and phrases used throughout this patent document: the tenets "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other objects, features and advantages of the present invention will become more apparent from the following detailed description when taken in conjunction with the accompanying, drawings in which.

DETAILED DESCRIPTION OF THE INVENTION

FIGS. 2 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication system. Embodiments of the present disclosure will be described herein below with reference to the accompanying drawings. In the following description, well-known functions or constructions are not described in detail since they would obscure the disclosure in unnecessary detail. Terms described below, which are defined considering functions in the present disclosure, can be different depending on user and operator's intention or practice. Therefore, the terms should be defined based on the disclosure throughout this specification. Preferred embodiments of the present disclosure will be described herein below with reference to the accompanying drawings. In the following description, well-known functions or constructions are not described in detail since they would obscure the disclosure in unnecessary detail. And, terms described below, which are defined considering functions in the present disclosure, can be different depending on user and operator's intention or practice. Therefore, the terms should be defined based on the disclosure throughout this specification.

The present disclosure provides a scheme for adaptively setting a reference light-receiving quantity used to detect the proximity (or approach) of an object by a proximity sensor in a portable terminal.

Figure 1:
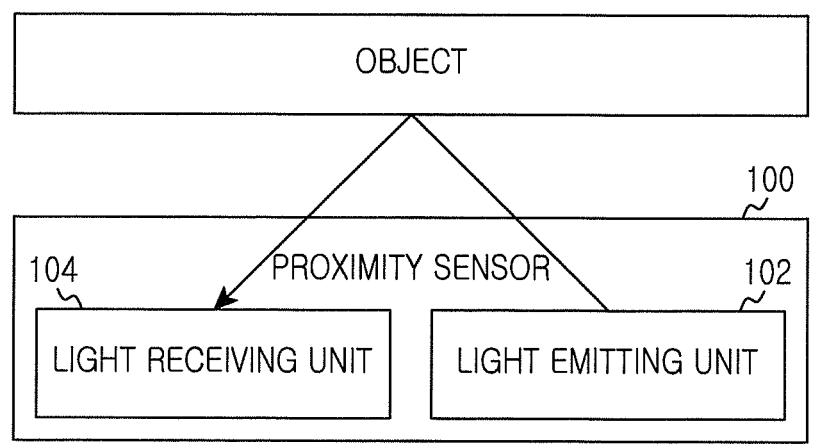
FIG. 1 block illustrates a conventional proximity sensor.
Figure 2:
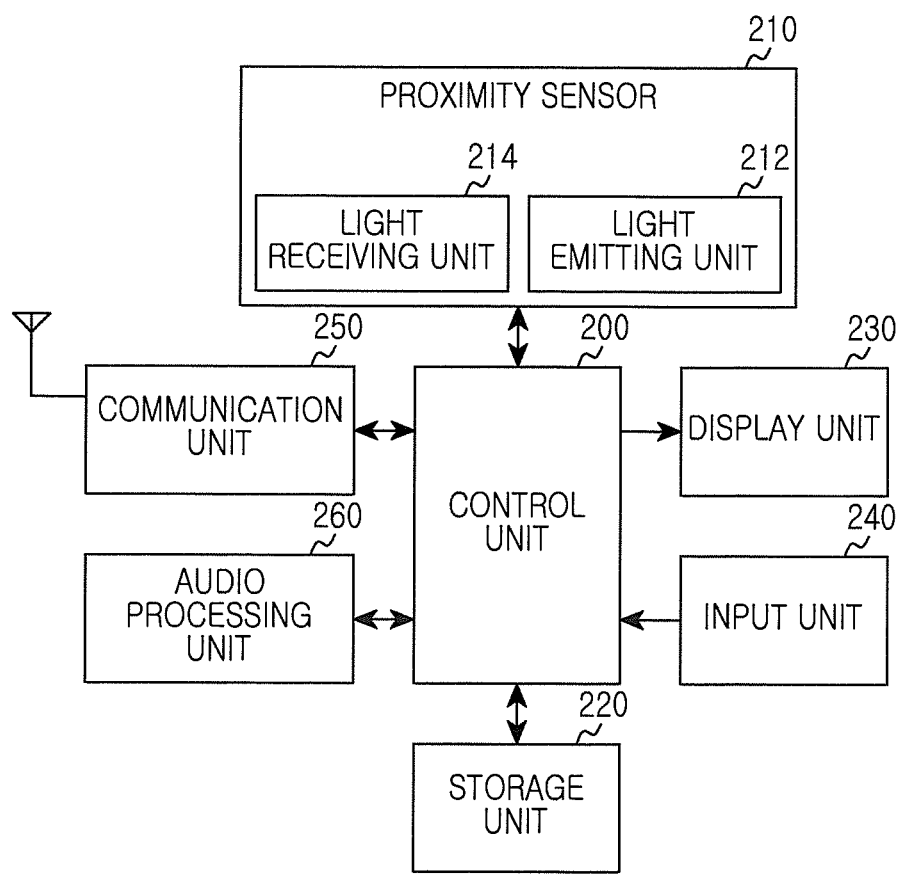
FIG. 2 block illustrates a portable terminal according, to an exemplary embodiment of the present disclosure.

FIG. 2 block illustrates a portable terminal according to an exemplary embodiment of the present disclosure.

Referring to FIG. 2, a portable terminal according to an exemplary embodiment of the present disclosure includes a control unit 200, a proximity sensor 210, a storage unit 220, a display unit 230, an input unit 240, a communication unit 250, and an audio processing unit 260.

The control unit 200 controls an overall operation of the portable terminal. The control unit 200 sets a reference light-receiving quantity used to detect the proximity of an object by the proximity sensor 210. For example, the control unit 200 sets the reference light-receiving quantity according to the hairstyle of a user. Herein, the hairstyle includes at least one of hair color and hair form. As another example, the control unit 200 sets the reference light-receiving quantity according to the average of light-receiving quantities during a reference time.

Also, the control unit 200 determines the proximity of an object by comparing a light-receiving quantity received from the proximity sensor 210 with the reference light-receiving quantity. For example, when the user attempts to make a call, the control unit 200 activates the proximity sensor 210. Thereafter, if detecting the proximity of an object by comparing the light-receiving quantity received from the proximity sensor 210 with the reference light-receiving quantity, the control unit 200 enables a screen lock mode. That is, if detecting the proximity of an object, the control unit 200 deactivates (i.e., turns off) the display unit 230. Upon termination of the call, the control unit 200 deactivates the proximity sensor 210.

Under the control of the control unit 200, the proximity sensor 210 detects the proximity of an object to the portable terminal. For example, the proximity sensor 210 includes a light emitting unit 212 and a light receiving unit 214. The proximity sensor 210 detects the quantify of light that is received by the light receiving unit 214 after being emitted by the light emitting unit 212 and reflected by the object (i.e., a light-receiving quantity), and provides the detected light-receiving quantity to the control unit 200. Herein, the proximity sensor 210 includes a photodiode. For example, the light emitting unit 212 includes a Light Emitting Diode (LED), and the light receiving unit 214 includes a photodiode.

The proximity sensor 210 is located adjacent to a region contacting an ear of the user during the call.

The storage unit 220 includes a program storing unit and a data storing unit. The program storing unit stores a program for controlling an operation of the portable terminal, and the data storing unit stores data generated during the execution of a program.

Under the control of the control unit 200, the display unit 230 displays the story information, menu screen and status information of the portable terminal. For example, the display unit 230 includes a touchscreen.

The input unit 240 provides the control unit 200 with input data corresponding to the user's selection.

The communication unit 250 processes signals transmitted/received through an antenna for voice and data communications.

The audio processing unit 260 processes audio signals inputted/outputted through the portable terminal.

In the above embodiment, the control unit 200 sets the reference light-receiving quantity used to detect the proximity of an object by the proximity sensor 210, and detects the proximity of an object by comparing a light-receiving quantity received from the proximity sensor 210 with the reference light-receiving quantity.

In another exemplary embodiment, the control unit 200 sets a reference light-receiving quantity used to detect the proximity of an object by the proximity sensor 210, and provides the reference light-receiving quantity to the proximity sensor 210. Accordingly, the proximity sensor 210 detects the proximity of an object by comparing a light-receiving quantity detected by the light receiving unit 214 with the reference light-receiving quantity received from the control unit 200.

In another exemplary embodiment, although not illustrated, the portable terminal further includes a setting control unit for setting a reference light-receiving quantity used to detect the proximity of an object by the proximity sensor 210. In this case, the control unit 200 detects the proximity of an object by comparing a light-receiving quantity received from the proximity sensor with the reference light-receiving quantity received from the setting control unit.

As described above, the control unit 200 sets the reference light-receiving quantity according to the user's hairstyle. For example, the control unit 200 displays a hairstyle input screen on the display unit 230 so that the user can select a hairstyle. Thereafter, the control unit 200 sets the reference light-receiving quantity according to the hairstyle selected by the user.

Hereinafter, a description will be given of a method for detecting the proximity (or approach) of an object by the proximity sensor 210 in the portable terminal according to an exemplary embodiment of the present disclosure.

Figure 3:
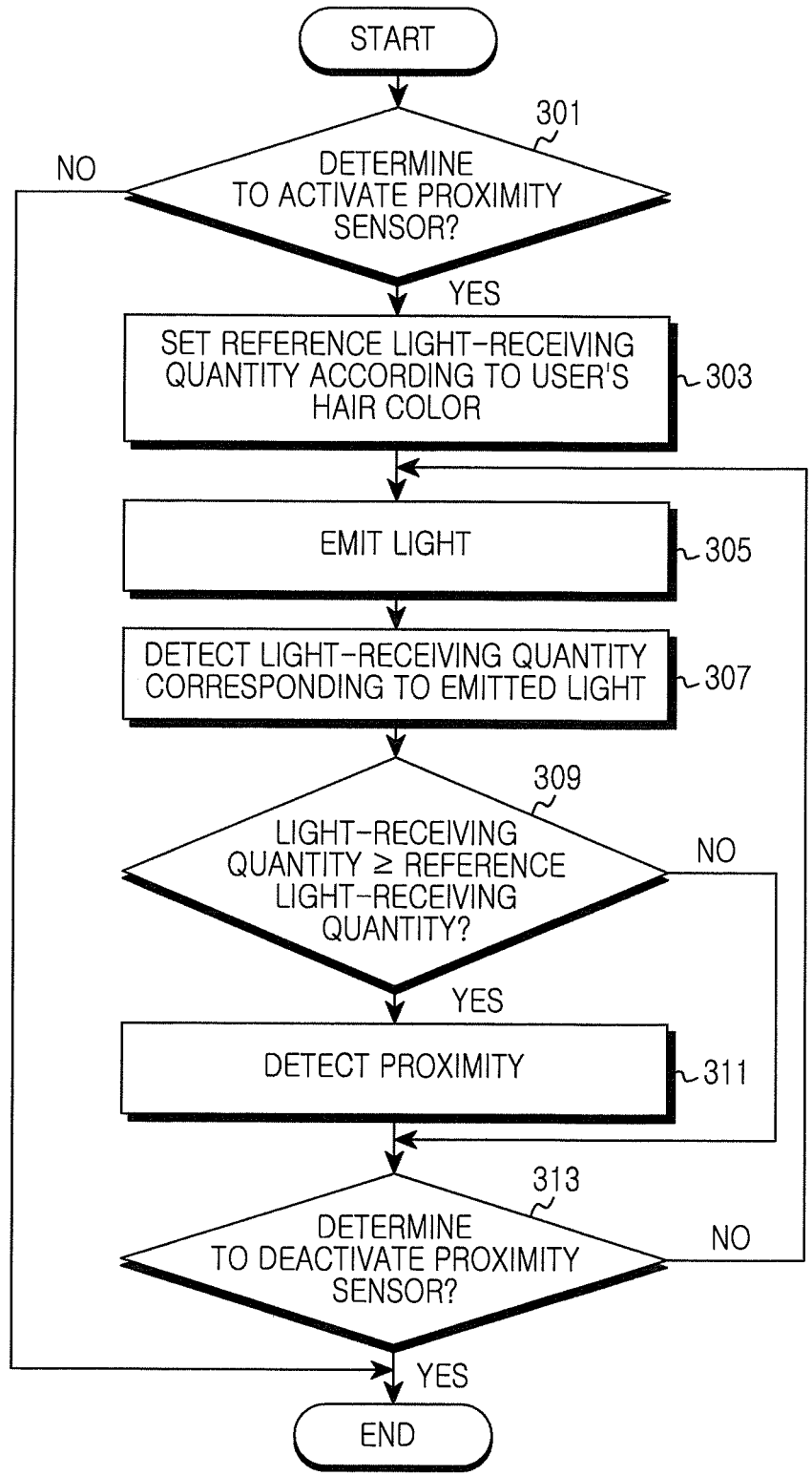
FIG. 3 illustrates a proximity detection process of a portable terminal according to an exemplary embodiment of the present disclosure.

FIG. 3 illustrates a proximity detection process of the portable terminal according to an exemplary embodiment of the present disclosure.

Referring to FIG. 3, in step 301, the portable terminal determines whether to activate the proximity sensor 210. For example, when the user attempts to make a call, the portable terminal activates the proximity sensor 210.

If determining not to activate the proximity sensor 210 (in step 301), the portable terminal ends the algorithm of the present disclosure.

Alternatively, if determining to activate the proximity sensor 210 (in step 301), the portable terminal proceeds to step 303. In step 303, the portable terminal sets a reference light-receiving quantity used to detect the proximity of an object by the proximity sensor 210, according to the user's hair color. For example, the portable terminal displays a hair color input screen on the display unit 230 so that the user can select a hair color. Thereafter, the portable terminal sets the reference light-receiving quantity according to the light reflectance of the hair color selected by the user.

In step 305, the portable terminal emits light by the light emitting unit 212 of the proximity sensor 210.

In step 307, the portable terminal detects a light-receiving quantity corresponding to the emitted light. That is, the portable terminal detects the quantity of light received by the light receiving unit 214 of the proximity sensor 210.

In step 309, the portable terminal compares the light-receiving quantity with the reference light-receiving quantity to determine the proximity/non-proximity of an object.

If the light-receiving quantity is smaller than the reference light-receiving quantity (in step 309), the portable terminal detects the non-proximity of an object and proceeds directly to step 313. In step 313, the portable terminal determines whether to deactivate the proximity sensor 210.

Alternatively, if the light-receiving quantity is larger than or equal to the reference light-receiving quantity (in step 309), the portable terminal proceeds to step 311. In step 311, the portable terminal detects the proximity of an object. For example, if detecting the proximity of an object, the portable terminal enables a screen lock mode. That is, if detecting the proximity of an object, the portable terminal deactivates (i.e., turns off) the display unit 230.

In step 313, the portable terminal determines whether to deactivate the proximity sensor 210. For example, the portable terminal determines whether the user has terminated the call. If the user has terminated the call, the portable terminal determines to deactivate the proximity sensor 210. Alternatively, if the user maintains the call, the portable terminal determines not to deactivate the proximity sensor 210.

If determining not to deactivate the proximity sensor 210 (in step 313), the portable terminal returns to step 305 to emit light.

Alternatively, if determining to deactivate the proximity sensor 210 (in step 313), the portable terminal terminates the activation of the proximity sensor 210. Thereafter, the portable terminal ends the algorithm of the present disclosure. For example, if having detected the proximity of an object to enable the screen lock mode, the portable terminal activates (i.e., turns on) the display unit 230 according to the deactivation of the proximity sensor 210.

In the above embodiment, the portable terminal sets the reference light-receiving quantity according to the light reflectance of the user's hair color. In order to reduce a load for setting the reference light-receiving quantity, the portable terminal may classify hair colors into three groups according to their light reflectances as shown in Table 2 below.

TABLE 2

| reflectance | Below 10% | Below 25% | Below 100% |
|---|---|---|---|
| Hair color | Black<br>Cobalt<br>Violet | Emerald<br>Brown<br>Grey<br>Green<br>Blue<br>Red<br>Light Green<br>Orange | Light Grey<br>Yellow<br>Sky Blue<br>Pink<br>Light Violet<br>Light Yellow<br>Light Sky<br>Light Pink<br>White |
| Reference color | Black | Grey | White |

If classifying hair colors into three groups as shown in Table 2, the portable terminal sets the reference light-receiving quantity according to the representative light reflectance of the group including the user's hair color.

In the above embodiment, the portable terminal sets the reference light-receiving quantity according to the light reflectance of the user's hair color.

Figure 4:
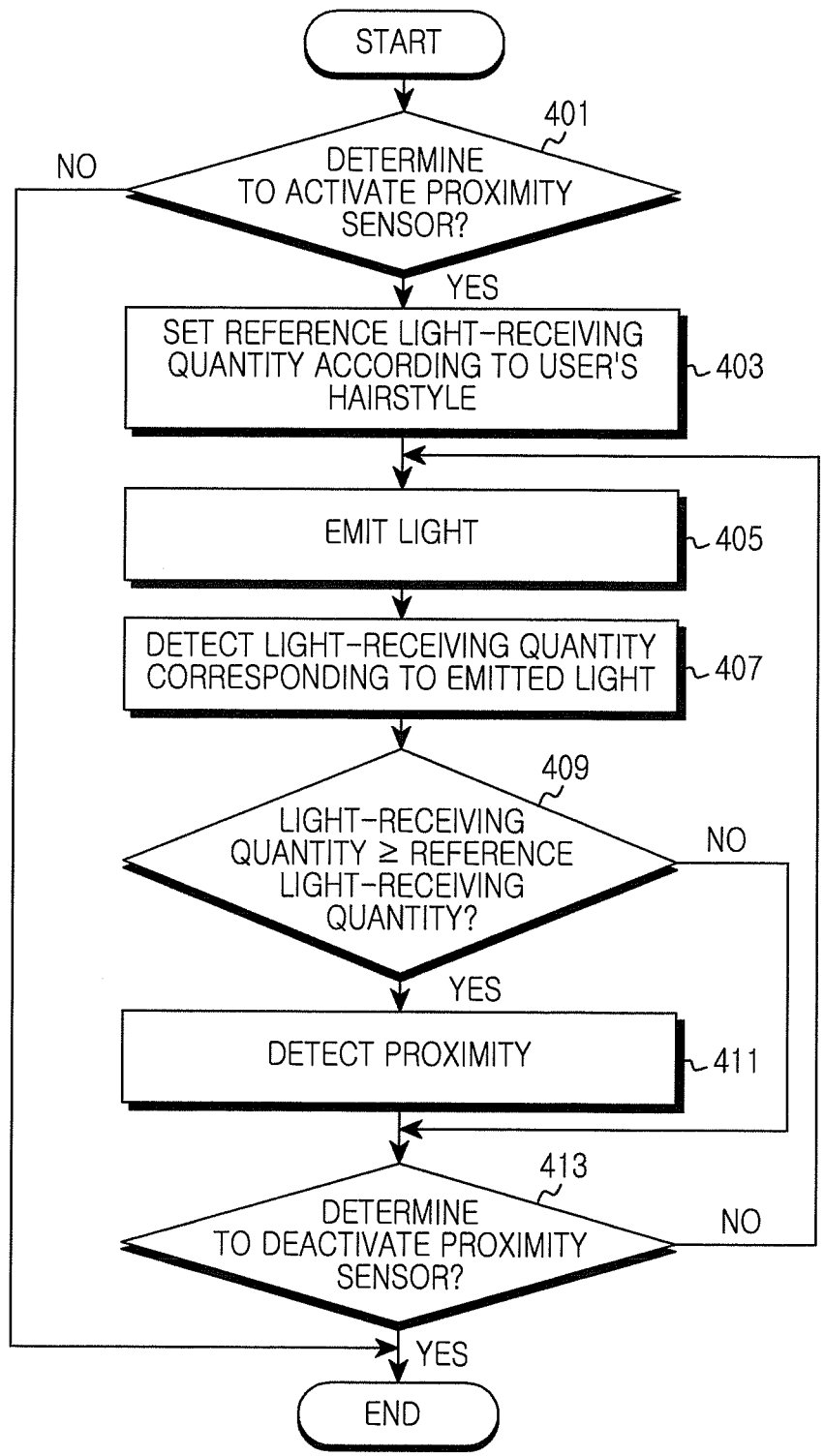
FIG. 4 illustrates a proximity detection process of a portable terminal according to another exemplary embodiment of the present disclosure.

In another exemplary embodiment, the portable terminal can set the reference light-receiving quantity according to the user's hairstyle as illustrated in FIG. 4.

FIG. 4 illustrates a proximity detection process of the portable terminal according to another exemplary embodiment of the present disclosure.

Referring to FIG. 4, in step 401, the portable terminal determines whether to activate the proximity sensor 210. For example, when the user attempts to make a call, the portable terminal activates the proximity sensor 210.

If determining not to activate the proximity sensor 210 (in step 401), the portable terminal ends the algorithm of the present disclosure.

Alternatively, if determining to activate the proximity sensor 210 (in step 401), the portable terminal proceeds to step 403. In step 403, the portable terminal sets a reference light-receiving quantity used to detect the proximity of an object by the proximity sensor 210, according to the user's hairstyle. Herein, the hairstyle includes at least one of hair color and hair form. The hair form indicates whether the user's ears are covered with the user's hairs. For example, the portable terminal displays a hairstyle input screen on the display unit 230 so that the user can select a hair color and a hair form. Thereafter, the portable terminal sets the reference light-receiving quantity according to the light reflectance corresponding to the hair color and the hair form selected by the user.

In step 405, the portable terminal emits light by the light emitting unit 212 of the proximity sensor 210.

In step 407, the portable terminal detects a light-receiving quantity corresponding to the emitted light. That is, the portable terminal detects the quantity of light received by the light receiving unit 214 of the proximity sensor 210.

In step 409, the portable terminal compares the light-receiving quantity with the reference light-receiving quantity to determine the proximity/non-proximity of an object.

If the light-receiving quantity is smaller than the reference light-receiving quantity (in step 409), the portable terminal detects the non-proximity of an object and proceeds directly to step 413. In step 413, the portable terminal determines whether to deactivate the proximity sensor 210.

Alternatively, if the light-receiving quantity is larger than or equal to the reference light-receiving quantity (in step 409), the portable terminal proceeds to step 411. In step 411, the portable terminal detects the proximity of an object. For example, if detecting the proximity of an object, the portable terminal enables a screen lock mode. That is, if detecting the proximity of an object, the portable terminal deactivates (i.e., turns off) the display unit 230.

In step 413, the portable terminal determines whether to deactivate the proximity sensor 210. For example, the portable terminal determines whether the user has terminated the call. If the user has terminated the call, the portable terminal determines to deactivate the proximity sensor 210. Alternatively, if the user maintains the call, the portable terminal determines not to deactivate the proximity sensor 210.

If determining not to deactivate the proximity sensor 210 (in step 413), the portable terminal returns to step 305 to emit light.

Alternatively, if determining to deactivate the proximity sensor 210 (in step 413), the portable terminal terminates the activation of the proximity sensor 210. Thereafter, the portable terminal ends the algorithm of the present disclosure. For example, if having detected the proximity of an object to enable the screen lock mode, the portable terminal activates (i.e., turns on) the display unit 230 according to the deactivation of the proximity sensor 210.

In the above embodiment, the portable terminal sets the reference light-receiving quantity according to the light reflectance corresponding to the user's hairstyle. In this case, the portable terminal can set the reference light-receiving quantity as shown in Table 3 below. Herein, it is assumed that the portable terminal classifies hair colors into three groups as shown in Table 2.

TABLE 3

| User's selection | | reference light-receiving quantity | note |
|---|---|---|---|
| Hair color | Hair style | | |
| Black<br>Grey<br>White | Ear exposed | γ | The color of reflector is determined according to the color of skin of the user as the reflector of the proximity sensor is an ear during calling when the user has a hair style exposing the ear. |
| Black<br>Grey<br>White | Ear not exposed | α<br>β<br>γ | The color of reflector is determined according to the color of hair of the user as the reflector of the proximity sensor is a hair during calling when the user has a hair style not exposing the ear. |

Table 3 shows the reference light-receiving quantity determined on the assumption that the user's skin is white or yellow.

In the above embodiment, the portable terminal sets the reference light-receiving quantity according to the light reflectance corresponding to the user's hairstyle.

Figure 5:
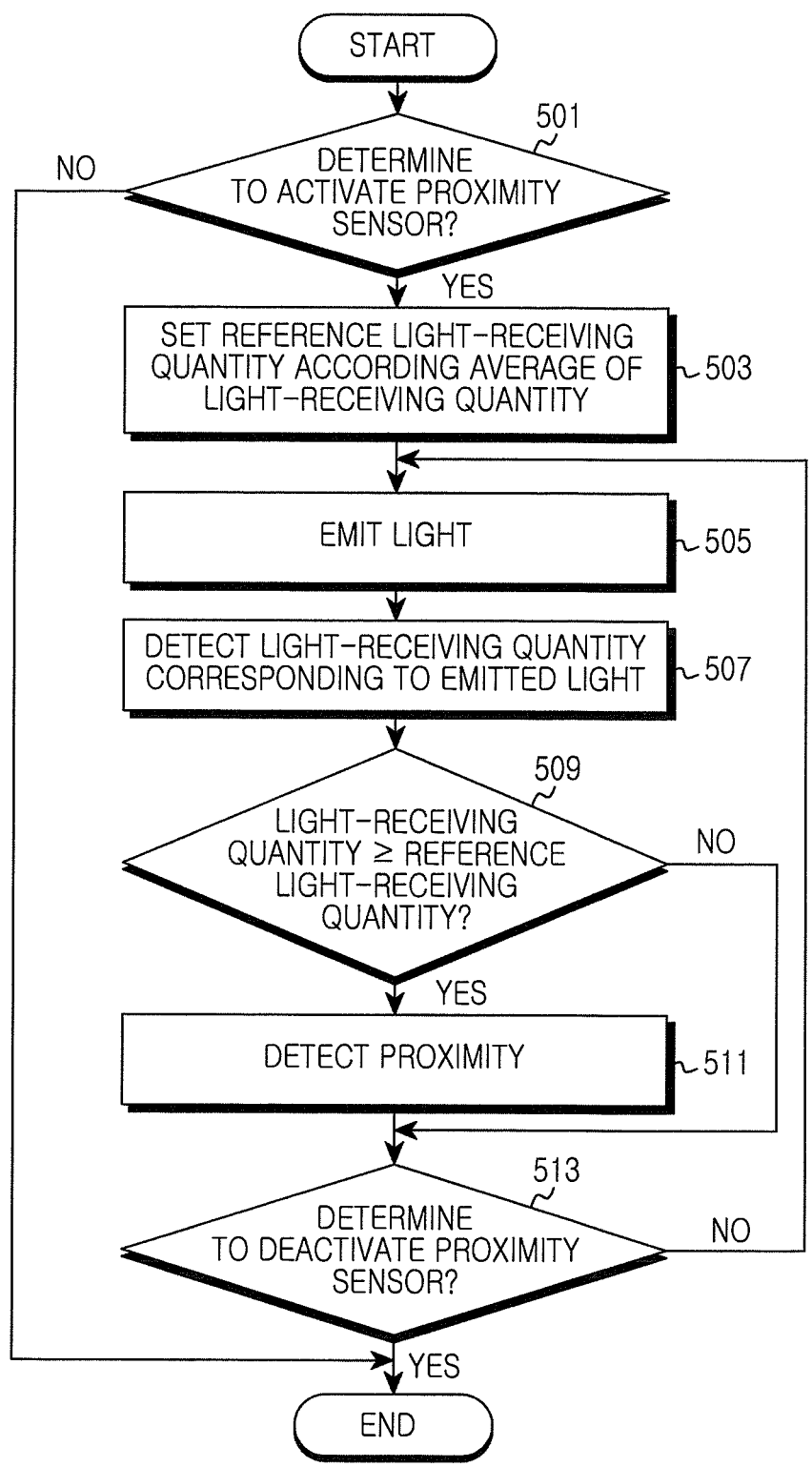
FIG. 5 is illustrates a proximity detection process of a portable terminal according to another exemplary embodiment of the present disclosure.

In another exemplary embodiment, the portable terminal can set the reference light-receiving quantity according to the average of light-receiving quantities as illustrated in FIG. 5.

FIG. 5 illustrates a proximity detection process of the portable terminal according to another exemplary embodiment of the present disclosure.

Referring to FIG. 5, in step 501, the portable terminal determines whether to activate the proximity sensor 210. For example, when the user attempts to make a call, the portable terminal activates the proximity sensor 210.

If determining not to activate the proximity sensor 210 (in step 501), the portable terminal ends the algorithm of the present disclosure.

Alternatively, if determining to activate the proximity sensor 210 (in step 501), the portable terminal proceeds to step 503. In step 503, the portable terminal sets a reference light-receiving quantity used to detect the proximity of an object by the proximity sensor 210, according to the average of light-receiving quantities detected by the light receiving, unit 214 of the proximity sensor 210.

In step 505, the portable terminal emits light by the light emitting unit 212 of the proximity sensor 210.

In step 507, the portable terminal detects a light-receiving quantity corresponding to the emitted light. That is, the portable terminal detects the quantity of light received by the light receiving unit 214 of the proximity sensor 210.

In step 509, the portable terminal compares the light-receiving quantity with the reference light-receiving quantity to determine the proximity/non-proximity of an object.

If the light-receiving quantity is smaller than the reference light-receiving quantity (in step 509), the portable terminal detects the non-proximity of an object and proceeds directly to step 513. In step 513, the portable terminal determines whether to deactivate the proximity sensor 210.

Alternatively, if the light-receiving quantity is larger than or equal to the reference light-receiving quantity (in step 509), the portable terminal proceeds to step 511. In step 511, the portable terminal detects the proximity of an object. For example, if detecting the proximity of an object, the portable terminal enables a screen lock mode. That is, if detecting the proximity of an object, the portable terminal deactivates (i.e., turns off) the display unit 230.

In step 513, the portable terminal determines whether to deactivate the proximity sensor 210. For example, the portable terminal determines whether the user has terminated the call. If the user has terminated the call, the portable terminal determines to deactivate the proximity sensor 210. Alternatively, if the user maintains the call, the portable terminal determines not to deactivate the proximity sensor 210.

If determining not to deactivate the proximity sensor 210 (in step 513), the portable terminal returns to step 505 to emit light.

Alternatively, if determining to deactivate the proximity sensor 210 (in step 513), the portable terminal terminates the activation of the proximity sensor 210. Thereafter, the portable terminal ends the algorithm of the present disclosure. For example, if having detected the proximity of an object to enable the screen lock mode, the portable terminal activates (i.e., turns on) the display unit 230 according to the deactivation of the proximity sensor 210.

In the above embodiment, if determining not to deactivate the proximity sensor 210 (in step 513), the portable terminal returns to step 505 to emit light.

In another exemplary embodiment, if determining not to deactivate the proximity sensor 210 (in step 513), the portable terminal can return to step 503 to reset the reference light-receiving quantity used to detect the proximity of an object by the proximity sensor 210.

According to the embodiments of the present disclosure described above, the portable terminal adaptively sets the reference light-receiving quantity according to the light reflectance of an object, thereby making it possible to maintain a constant proximity detecting distance of the proximity sensor.

While the invention has been shown and described with reference to certain exemplary embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

What is claimed is:

1. A method for detecting the proximity of an object, in a portable terminal, the method comprising:
   setting a reference light-receiving quantity according to a hairstyle of a user of the portable terminal;
   emitting light;
   detecting a light-receiving quantity corresponding to the emitted light; and
   determining a proximity or non-proximity of an object by comparing the light-receiving quantity with the reference light-receiving quantity.

2. The method of claim 1, further comprising:
   determining whether the user attempts to make a call;
   activating the proximity sensor if the user attempts to make a call; and
   setting the reference light-receiving quantity according to the user's hairstyle if the proximity sensor is activated.

3. The method of claim 1, wherein the hairstyle includes at least one of hair color and hair form.

4. The method of claim 1, wherein determining the proximity or non-proximity of the object comprises detecting the proximity of the object to the proximity sensor if the light-receiving quantity is larger than the reference light-receiving quantity.

5. The method of claim 4, further comprising enabling a screen lock mode in the case of detecting the proximity of the object to the proximity sensor.

6. A method for detecting the proximity of an object, in a portable terminal, the method comprising:
   setting a reference light-receiving quantity according to an average of light-receiving quantities measured during a predetermined time;
   emitting light;
   detecting a light-receiving quantity corresponding to the emitted light; and
   determining a proximity or non-proximity of an object by comparing the light-receiving quantity with the reference light-receiving quantity.

7. The method of claim 6, further comprising:
   determining whether the user attempts to make a call;
   activating the proximity sensor if the user attempts to make a call; and
   setting the reference light-receiving quantity according to the average of the measured light-receiving quantities if the proximity sensor is activated.

8. The method of claim 6, wherein determining the proximity or non-proximity of the object comprises detecting the proximity of the object to the proximity sensor if the light-receiving quantity is larger than the reference light-receiving quantity.

9. The method of claim 8, further comprising enabling a screen lock mode in the case of detecting the proximity of the object to the proximity sensor.

10. An apparatus capable of detecting the proximity of an object, in a portable terminal, the apparatus comprising:
    a proximity sensor configured to emit a light and detect a light-receiving quantity corresponding to the emitted light; and
    a control unit configured to determine a proximity or non-proximity of an object by comparing the light-receiving quantity detected by the proximity sensor with a reference light-receiving quantity set according to a hairstyle of a user of the portable terminal.

11. The apparatus of claim 10, wherein the proximity sensor is activated in response to an attempt to make a call by the user.

12. The apparatus of claim 10, wherein the proximity sensor comprises:
- a light emitting unit configured to emit the light; and
- a light receiving unit configured to detect the light-receiving quantity corresponding to the emitted light.

13. The apparatus of claim 10, wherein the control unit is configured to set the reference light-receiving quantity according to the user's hairstyle including at least one of: hair color and hair form.

14. The apparatus of claim 10, wherein the control unit is configured to detect the proximity of the object to the proximity sensor if the detected light-receiving quantity is larger than the reference light-receiving quantity.

15. The apparatus of claim 14, wherein the control unit is configured to enable a screen lock mode in response to the control unit detecting the proximity of the object to the proximity sensor.

16. An apparatus capable of detecting the proximity of an object, in a portable terminal, the apparatus comprising:
- a proximity sensor configured to emit a light and detect a light-receiving quantity corresponding to the emitted light; and
- a control unit configured to determine a proximity or non-proximity of an object by comparing the light-receiving quantity detected by the proximity sensor with a reference light-receiving quantity set according to an average of light-receiving quantities measured during a predetermined time.

17. The apparatus of claim 16, wherein the proximity sensor is activated in response to an attempt to make a call by the user.

18. The apparatus of claim 16, wherein the proximity sensor comprises:
- a light emitting unit configured to emit the light; and
- a light receiving unit configured to detect the light-receiving quantity corresponding to the emitted light.

19. The apparatus of claim 16, wherein the control unit is configured to detect the proximity of the object to the proximity sensor if the detected light-receiving quantity is larger than the reference light-receiving quantity.

20. The apparatus of claim 19, wherein the control unit is configured to enable a screen lock mode in response to the control unit detecting the proximity of the object to the proximity sensor.

* * * * *